United States Patent [19]
Kato et al.

[11] Patent Number: 5,144,497
[45] Date of Patent: Sep. 1, 1992

[54] SWCHWARZSCHILD OPTICAL SYSTEM

[75] Inventors: Mikiko Kato, Hachiouji; Yoshinori Iketaki, Oume, both of Japan

[73] Assignee: Olympus Optical Co., Ltd., Tokyo, Japan

[21] Appl. No.: 489,006

[22] Filed: Mar. 6, 1990

[30] Foreign Application Priority Data

Mar. 7, 1989 [JP] Japan ................................. 1-54751

[51] Int. Cl.$^5$ ........................... G02B 5/10; G02B 21/00
[52] U.S. Cl. ................................... 359/859; 359/366; 359/584
[58] Field of Search ............... 350/164, 166, 620, 505, 350/311, 619, 622, 504, 624; 378/84, 85, 43; 359/366, 370, 380, 584, 589, 859, 865, 884

[56] References Cited

U.S. PATENT DOCUMENTS

| | | | |
|---|---|---|---|
| 4,370,750 | 1/1983 | Hoover | 378/43 |
| 4,562,583 | 12/1985 | Hoover et al. | 378/43 |
| 4,693,933 | 9/1987 | Keem et al. | 378/43 |
| 4,812,030 | 3/1989 | Pinson | 350/620 |
| 4,863,253 | 9/1989 | Shafer et al. | 350/620 |
| 4,941,163 | 7/1990 | Hoover | 378/43 |

OTHER PUBLICATIONS

Underwood et al.; "The Renaissance of X-Ray Optics" Physics Today; Apr. 1984, pp. 44–52.
Barbee et al.; "Layered Synthetic Microstructures: Properties and Applications In X-Ray Astronomy"; SPIE, vol. 184 Space Optics-Imaging X-Ray Optics Workshop (1970) pp. 123–130.

(List continued on next page.)

*Primary Examiner*—Bruce Y. Arnold
*Assistant Examiner*—R. D. Shafer
*Attorney, Agent, or Firm*—Cushman, Darby & Cushman

[57] ABSTRACT

In a Schwarzschild optical system comprising a concave mirror having an aperture at its center and a convex mirror disposed in face of the concave mirror, the convex mirror is coated with a multilayer film such that an incident angle $\theta_{02}$ on the convex mirror at which reflectance is maximized with respect to light of a particular wavelength satisfies the following condition:

By such structure, the Schwarzshild optical system of the present invention provides an important advantage in practical use that transmittance efficiency is extremely favorable.

$$\alpha(\theta_{02}, N.A.) \geq 0.5\, \alpha_{max}$$

$$\theta 1_{min} < \theta_{01} < \theta 1_{max}$$

where $$\alpha(\theta_{02}, N.A.) = \left[ \frac{1}{2\epsilon^2} \{\log| (\epsilon\theta - \theta_{02})^2 + B| + \log| (\epsilon + \theta_{02})^2 + B| \} + \frac{\theta_{02}}{\epsilon^2 \cdot \sqrt{B}} \tan^{-1} \frac{\epsilon\theta - \theta_{02}}{\sqrt{B}} - \tan^{-1} \frac{\epsilon\theta\, \theta_{02}}{\sqrt{B}} \right]_{\theta_{min}}^{\theta_{max}}$$

and further $$\epsilon = \frac{1}{2}\left(1 + \frac{1}{m}\right) + \frac{\rho_0 - r_1}{r_1}$$

$$\theta_{max} = \sin^{-1}(N.A.)$$

$$\theta_{min} = \frac{r_0}{\rho_0 - r_1 + r_2} \cdot \frac{1}{m} \cdot (N.A.)$$

$$B = 2\beta/(\sin\theta_{02} \cdot \cos\theta_{02})$$

$\beta$ = mean value of an imaginary part of complex index of refraction in the multilayer film.
$\alpha_{max}$ = maximum value of $\alpha(\theta_{02}, N.A.)$ 4 Claims, 10 Drawing Sheets

OTHER PUBLICATIONS

Underwood et al.; "Layered Synthetic Microstructures as Bragg Diffractors For X Ray and Extreme Ultraviolet: Theory and Predicted Performance"; Applied Optics: vol. 20, No. 17 Sep. 1981 pp. 3027-3034.

T. Namioka, "Current Research Activities in the Field of Multilayers for Soft X-Rays in Japan", Revue Phys. Appl. 23 (1988) Oct. 1988, pp. 1711-1726.

A. K. Head, "The Two-Mirror Aplanat" Proc. Phys. Soc. LXX; (1957) pp. 945-949.

P. Erdos, "Mirror Anastigmat With Two Concentric Spherical Surfaces", Journal of the Optical Society of America, vol. 49, No. 9, 1959, pp. 877-886.

Lovas et al., "Design And Assembly Of A High Resolution Schwarzschild -Microscope For Soft X-Rays", SPIE 316 High Resolution Soft X-Ray Optics, pp. 90-97 (1981).

B. Henke "Low Energy X-Ray Spectroscopy With Crystals and Multilayers", American Institute of Physics 1981 pp. 85-96.

Henke, et al., "Low-Energy X-Ray Interaction Coefficients: Photoabsorption, Scattering, and Reflection", Atomic Data and Nuclear Data Tables, vol. 27, No. 1, Jan., 1982 pp. 1, 2, 42 and 49.

MAX. REFLECTION

SWCHWARZSCHILD OPTICAL SYSTEM

BACKGROUND OF THE INVENTION a) Field of the Invention

This invention relates to a Schwarzschild optical system used in an objective lens system for X-ray microscopes, a demagnifying optical system for X-ray lithographic apparatus and the like.

b) Description of the Prior Art

The Schwarzschild optical system is constructed so that as shown in FIG. 1, a concave mirror 1 having an aperture at its center portion and a convex mirror 2 are coaxially arranged between an object point O and an image point I and in the case where a radiation source is placed at the object point O, light emitted from the radiation source is reflected in order of the concave mirror 1 and the convex mirror 2 and converged at the image point I.

In such a Schwarzschild optical system, conditions for correcting coma and spherical aberrations in a paraxial region are given by A. K. Head (A. K. Head, Proc. Phys. Soc. 70,945 (1957)), which are to satisfy three formulas:

$$\rho + r + l = \rho_0 + r_0 + l_0 \quad (i)$$

$$\sin \theta = m \sin u \text{ (m: magnification)} \quad (ii)$$

$$\frac{1}{\rho} \frac{d\rho}{d\theta} = -\tan \theta_1 \quad (iii)$$

With respect to the reference symbols in these formulas which are as shown in FIG. 1, $\rho_0$, $l_0$ and $r_0$ and $\rho$, $l$ and $r$ are distances between the object point O and the concave mirror 1, between the concave mirror 1 and the convex mirror 2, and between the convex mirror 2 and the image point I along an optical axis and those along a ray of light connecting the object point O with the image point I, respectively, $\theta$ and u are angles made by the optical axis with the light ray at the object point O and the image point I, respectively, $\theta_1$ is the incident angle of the light ray entering the convex mirror 1, and m is the magnification of the Schwarzschild optical system. From these requirements, radii of curvature $r_1$ and $r_2$ of the concave mirror 1 and the con mirror 2 are determined by the following formulas (1) and (2):

$$r_1 = 2 m \, l_0 \rho_0 / (m\rho_0 + m l_0 - r_0) \quad (1)$$

$$r_2 = 2 \, l_0 r_0 / (r_0 + l_0 - m\rho_0) \quad (2)$$

The Schwarzschild optical system fulfilling the above formulas (1) and (2) has the arrangement referred to as a homocentric type in which the center of curvature of the concave mirror coincides with that of the convex mirror so that the incident angle of the ray incident on each mirror (particularly, the incident angle $\theta_1$ on the concave mirror 1) is small. A design method of the homocentric type Schwarzschild optical system is proposed by P. Erdös (P. Erdös, Opt. Soc. America 49,877 (1959)). Specifically, when the magnification m is indicated, the radius of curvature $r_1$ of the concave mirror 1, a distance W from the object point O to a common center of curvature of the concave and convex mirrors, and the distance $r_0$ from a vertex T of the convex surface of the convex mirror 2 to the image point I are obtained, by ratios with the radius of curvature $r_2$ of the convex mirror 2, from the following formulas.

When $r_2 = 1$, $$r_1 = \frac{1}{2} + \frac{1}{x} - \sqrt{\frac{1}{x} - \frac{3}{4}} \quad (3)$$

$$W = -r_1/(2 - 1/x) \quad (4)$$

$$r_0 = (1 - r_1 \cdot x)/(2 r_1 \cdot x - 1) \quad (5)$$

Here, $$x = (-b \pm \sqrt{b^2 - ac})/a \quad (6)$$

$$a = 4\left(\frac{1}{m^2} - \frac{1}{m} + 1\right)$$

$$b = -\frac{2}{m^2} + \frac{3}{m} - 3$$

$$c = \left(\frac{1}{m} - 1\right)^2$$

Tables 1, 2, 3 and 4 show examples of the Schwarzschild optical system having the magnifications of 100×, 50×, 20× and 10× obtained according to these formulas (see FIG. 2).

TABLE 1

| |
|---|
| m = 100 |
| r1 = 2.67 |
| W = 0.808 |
| r0 = 79.8 |

TABLE 2

| |
|---|
| m = 50 |
| r1 = 2.71 |
| W = 0.807 |
| r0 = 39.4 |

TABLE 3

| |
|---|
| m = 20 |
| r1 = 2.87 |
| W = 0.805 |
| r0 = 15.1 |

TABLE 4

| |
|---|
| m = 10 |
| r1 = 3.18 |
| W = 0.802 |
| r0 = 7.02 |

Apart from this, on the other hand, the Schwarzschild optical system in which aberration is favorably corrected by the use of a so-called automatic design program is available. FIG. 3 and Tables 5, 6 and 7 show examples of such an optical system. Any of these examples is a heterocentric optical system in which the center of curvature of the convex mirror is shifted from that of the concave mirror toward the object point. Further, SPIE Vo. 316,316c (1981), as shown in FIG. 4 and Table 8, discloses another heterocentric optical system in which the center of curvature of the convex mirror is shifted form that of the concave mirror toward the image point.

TABLE 5 m = 100
r1 = 2.67
W1 = 0.810
W2 = 0.811
r0 = 78.2

TABLE 6 m = 50
r1 = 2.86
W1 = 0.808
W2 = 0.819
r0 = 36.8

TABLE 7 m = 10
r1 = 3.18
W1 = 0.804
W2 = 0.806
r0 = 4.86

TABLE 8 m = 20
r1 = 2.58
W1 = 0.810
W2 = 0.792
r0 = 15.8

Each of the optical systems diminishes the shift between the centers of curvature of the convex and concave mirrors and has properties very similar to the homocentric optical system. According to the discussion of the inventors of this application, if the values of the radii of curvature $r_1$ and $r_2$ are within the range of nearly ±10% of those given by formulas (1) and (2), namely, $$2m\, l_0 \rho_0/(m\rho_0+ml_0-r_0) \times 0.9 \leq r_1 \leq 2m\, l_0 \rho_0/(m\rho_0+ml_0-r_0) \times 1.1$$

$$2l_0 r_0/(r_0+l_0-m\rho_0) \times 0.9 \leq r_2 \leq 2l_0 r_0/(r_0+l_0-m\rho_0) \times 1.1,$$

the argument on the homocentric optical system will apply virtually to this case as it is. As such, the homocentric optical system will be variously discussed in the following description.

The function of the Schwarzschild optical system is as follows:

In FIG. 5, the light emanating from the object point O traverses an effective aperture, shown in hatching, of the outer portion of the concave mirror of the Schwarzschild optical system and is first incident on the mirror surface of the concave mirror 1. After this, the light reflected from the mirror surface at a certain reflectance enters the mirror surface of the concave mirror 2. The light reflected from this mirror surface at a certain reflectance is then collected at the image point I.

Also, as a means for bringing about a considerable reflectance when the light in an X-ray wave band is incident on the mirror surface at a minute angle with respect to the normal of the mirror surface, it is known that a multilayer film reflecting mirror is used in which a multilayer film is formed as lamination on a substrate. The multilayer film has dispersion properties relying on an incident angle of light and on an wavelength of incident light.

In some of multilayer films, for example, as shown in FIG. 6, a pair of layers is formed with two kinds of substances a, b, which are laminated on the substrate 3 by the period of constant thickness. In such an instance, respective thicknesses $d_1$, $d_2$ of the substances a, b are optimized by Fresnel's recurrence formula (Takeshi Namioka et al., "Designs, Manufactures and Evaluations of Multilayer Film Mirrors for Soft X-Rays", Journal of the Japanese Society of Precision Engineering, 52/11/1986, pp. 1843-1846) so that the reflectance is maximized when light having a wavelength λ is incident on a film surface at a certain angle $\theta_0$ made with the normal of the film surface.

Regarding curve (a) in FIG. 7, in the multilayer film comprising 100 pairs of layers of Ni—Sc in which the layer thicknesses $d_1$, $d_2$ are optimized by Fresnel's recurrence formula so that $\theta_0=0°$ when the light of the wavelength λ=39.8 Å is incident on the film surface, namely, so that the reflectance is maximized when the light enters perpendicular to the film surface, incident angle distribution of reflectances calculated by the Fresnel's recurrence formula is shown. In the same manner, curves (b), (c) and (d) in FIG. 7 show the incident angle distribution of reflectances relative to the multilayer such as to be maximized in the cases where $\theta_0$ is 2.8°, 7.4° and 10°, respectively. According to these data, when the incident angle $\theta_0$ providing the maximum reflectance is approximately zero, reflectance distribution is regarded as nearly constant one in the vicinity of vertical incidence and the half width of the reflectance distribution trends to decrease as the incident angle $\theta_0$ increases.

In addition, the multilayer film having a non-periodic structure proposed in Takeshi Namioka et al., "Developments of Light Sources and Optical Systems for Soft X-Ray Lithography", Report of Research by Scientific Research-Aid Fund for the 1985 Fiscal Year (Test Research) (2)), pp. 1-36, 1986 is also available.

As stated above, the Schwarzschild optical system refers to a vertical incidence type optical system in which the light is incident on each mirror surface at a small angle. Consequently, where the optical system is employed in the X-ray wave band, it is necessary to improve the reflectance by coating of the multilayer film on each mirror surface. Because, however, the multilayer film has the dispersion properties relying on the wavelength and the incident angle in the X-ray region, even though the coating of the multilayer film is applied without any consideration for such properties, the reflectance is not improved on each mirror surface, depending on the relationship with the incident angle of light determined by the wavelength of light and by the positional relation between the reflecting mirrors and the object and image points constituting the optical system, and as a result, an image surface will become dark. In the past, no effort has been made to secure the optimum values of parameters of the multilayer film with which each mirror surface is coated, such as, for example, substances, the number of layers and layer thicknesses.

SUMMARY OF THE INVENTION

The object of the present invention, in view of the above problems, is to provide a Schwarzschild optical system in which the multilayer film coating each mirror surface is designed so that the image surface is made bright as far as possible, thereby enhancing a reflection efficiency.

This object is accomplished, according to the present invention, by the structure that the Schwarzschild optical system with the magnification m, comprising a multilayer film concave mirror having the radius of curvature $r_1$ and an aperture at its center portion, arranged the distance $\rho_0$ apart from the object point toward the image point and a multilayer film convex mirror having the radius of curvature $r_2$, arranged the distance $r_0$ apart from the image point toward the object point and the vertex distance $l_0$ apart from the concave mirror, refers to the optical system similar to the homocentric type satisfying particularly $$2m \, l_0\rho_0/(m\rho_0 m l_0 - r_0) \times 0.9 \leq r_1 \leq 2m$$
$$l_0\rho_0/(m\rho_0 + m l_0 - r_0) \times 1.1$$

$$2l_0 r_0/(r_0 + l_0 - m\rho_0) \times 0.9 \leq r_2 \leq 2$$
$$l_0 r_0/(r_0 + l_0 - m\rho_0) \times 1.1$$

and where an effective diameter H of the convex mirror, in accordance with a numerical aperture N.A. on the side of the object point of the Schwarzschild optical system, is given by $$\frac{r_0}{m} (N.A.) \times 0.8 \leq H \leq \frac{r_0}{m} (N.A.) \times 1.5,$$

the convex mirror is provided with such a uniform multilayer film that an incident angle $\theta_{02}$ at which the reflectance is maximized with respect to light of a particular wavelength $\lambda$ satisfies the following condition in regard to the numerical aperture:

$$a(\theta_{02}, N.A.) \geq 0.5 \, a_{max}$$

where $$a(\theta_{02}, N.A.) =$$

$$\left[ \frac{1}{2 \, \epsilon^2} \{ \log|(\epsilon\theta - \theta_{02})^2 + B| + \log|(\epsilon\theta + \theta_{02})^2 + B| \} + \right.$$

$$\left. \frac{\theta_{02}}{\epsilon^2 \cdot \sqrt{B}} \left\{ \tan^{-1} \frac{\epsilon\theta - \theta_{02}}{\sqrt{B}} - \tan^{-1} \frac{\epsilon\theta + \theta_{02}}{\sqrt{B}} \right\} \right]_{\theta_{min}}^{\theta_{max}}$$

and further $$\epsilon = \frac{1}{2} \left( 1 + \frac{1}{m} \right) + \frac{\rho_0 - r_1}{r_1}$$

$$\theta_{max} = \sin^{-1} (N.A.)$$

$$\theta_{min} = \frac{r_0}{\rho_0 - r_1 + r_2} \cdot \frac{1}{m} \cdot (N.A.)$$

$$B = 2\beta/(\sin \theta_{02} \cdot \cos \theta_{02})$$

$\beta$ = mean value of an imaginary part of complex index of refraction in the multilayer film.
$a_{max}$ = maximum value of $a(\theta_{02}, N.A.)$ Moreover, as for the concave mirror, its mirror surface is coated with such a uniform multilayer film that an incident angle $\theta_{01}$ at which the reflectance is maximized with respect to the light of the wavelength $\lambda$ satisfies the following condition:

$$\theta_{1min} < \theta_{01} < \theta_{1max}$$

where $$\theta_{1min} = \frac{(\rho_0 - r_1)}{r_1} \theta_{min}$$

$$\theta_{1max} = \frac{(\rho_0 - r_1)}{r_1} \theta_{max}.$$

These conditions will detailedly be explained in the following.

(1) First of all, a description will be given of a way of evaluating the brightness of an image formed by the Schwarzschild optical system. In the Schwarzschild optical system arranged as shown in FIG. 5, a total transmittance $\alpha$ on the image surface is defined as $$\alpha = Ie \cdot \int_{\text{aperture}} R(\theta_1, \theta_{01}) \cdot R(\theta_2, \theta_{02}) d\Omega \tag{7}$$

$$= Ie \cdot \int_0^{2\pi} \int_{\theta_{min}}^{\theta_{max}} R(\theta_1, \theta_{01}) \cdot R(\theta_2, \theta_{02}) \cdot \sin\theta \cdot d\theta \cdot d\phi$$

where $\Omega$ is the solid angle subtended by the effective aperture of the optical system at the objective point, $\theta_{max}$ and $\theta_{min}$ are the maximum value and the minimum value of an angle made by a ray of light emanating from the object point, capable of entering the effective aperture of the optical system, with the optical axis, $R(\theta_k, \theta_{0k})$ is the reflectance at a k-th reflecting surface (k=1 or 2), Ie is the energy intensity of light incident on the optical system at a unit time per unit solid angle, $\theta_k$ is the incident angle at which light emanating from the object point at angle $\theta$ is incident on the k-th reflecting surface, and $\theta_{0k}$ is the incident angle at which the reflectance is maximized when light of a particular wavelength is made to enter the k-th reflecting surface.

The symbol $\alpha$ represents the amount of light passing through the Schwarzschild optical system to reach the image point with respect to light emanating from the object point.

Formula (7) can be rewritten as follows:

$$\alpha = Ie \cdot \lim_{n_\phi \to \infty} \lim_{n_\theta \to \infty} \sum_{i=0}^{n_\phi} \frac{\theta_{max} - \theta_{min}}{\sum_{j=0}^{\Delta\theta}} R(\theta_1, \theta_{01}) \cdot R(\theta_2, \theta_{02}) \cdot \tag{8}$$

$$\sin \theta \cdot \Delta\theta \cdot \Delta\phi$$

Here, $$\theta = \theta + j \cdot \Delta\theta,$$

$$\Delta\phi = 2\pi/n_\phi, \Delta\theta = 2\pi/n_\theta$$

where j, $n_\phi$ and $n_\theta$ are integers.

The total transmittance $\alpha$, exactly speaking, should be calculated by the use of formula (8). Specifically, after setting of the incident angle $\theta_{0k}$, the light emanating from the object point O at the angle $\theta$ is traced to calculate numerically the incident angle $\theta_k$ at the k-th reflecting surface, thereby securing the reflectance $R(\theta_k, \theta_{0k})$ from Fresnel's recurrence formula for substitution in formula (8), and if the summation of $\theta$ and $\phi$ is obtained, then the total transmittance $\alpha$ will be determined.

Since different values are obtained as the total transmittance $\alpha$ when the calculation is performed in the same manner by changing the value of the incident angle $\theta_{0k}$, it follows that a bright optical system can be brought about, if the following calculation is repeated so that the combination of the incident angle $\theta_{0k}$ at which the total transmittance $\alpha$ reaches a maximum $(\alpha_{max})$ is derived and the multilayer film formed on each reflecting surface is selected to the angle $\theta_{0k}$.

(2) Thus, the briefest possible way of determining the total transmittance $\alpha$ will next be explained.

First, approximations are given by $$\theta_1 \approx \frac{W}{r_1} \theta \quad (9)$$

$$\theta_{max} \approx \sin^{-1}(N.A.) \quad (10)$$

$$\theta_{min} \approx \frac{1}{w + r_2} \cdot H \quad (11)$$

where H is the effective diameter of the convex mirror and is given nearly by $$H = \frac{r_0}{m}(N.A.)$$

Unless each angle is considerably increased, it is favorably approximated. If the value of the effective diameter H is larger than the result derived from the preceding formula, part of light rays coming from the object point is eclipsed by the convex mirror and fails to be incident on the Schwarzschild optical system, while on the other hand, if small, an effective numerical aperture of the optical system diminishes in accordance with the value of the effective diameter H. In either case, considerable deviation of the value of the effective diameter of the convex mirror from $r_0/m$ causes the amount of light reaching the image surface to reduce and results in a dark image surface. If the value of the diameter H is within the range of the following formula, the reduction of the amount of light attributable to the eclipse and the decrease of the numerical aperture is negligible.

$$\frac{r_0}{m}(N.A.) \times 0.8 \leq H \leq \frac{r_0}{m}(N.A.) \times 1.5$$

The effective diameter of the convex mirror will hereunder be explained as $$H = \frac{r_0}{m}(N.A.).$$

As mentioned above, the optical system of the present invention is of a homocentric type in view of its principle and the distance W, the radius of curvature $r_1$, and the distance $r_0$ are calculated as ratios of the radius of curvature $r_2$ with respect to the magnification m. Accordingly, the incident angle $\theta_{01}$ is such that its range can be determined from the magnification m and the numerical aperture N.A.. Here, the incident angles at the k-th reflecting surface of the light entering the Schwarzschild optical system at the angles of the upper and lower limit values $\theta_{max}$ and $\theta_{min}$ of the summation are taken as $\theta_{kmax}$ and $\theta_{kmin}$, respectively and the incident angle $\theta_{0k}$ providing the maximum value $\alpha_{max}$ of the total transmittance at each reflecting surface is assumed to take a value between $\theta_{kmax}$ and $\theta_{kmin}$. As is obvious from the curves exhibiting incident angle dependence shown in FIG. 7, such an assumption has sufficient properness. Considering the first surface in particular, the incident angle at the first surface is nearly 0° as described above, so that when the incident angle $\theta_{01}$ is set in the range of $\theta_{1min} \leq \theta_{01} \leq \theta_{1max}$, it is found from FIG. 7 that the reflectance approaches to the maximum value at the angle ranging between $\theta_{1min}$ and $\theta_{1max}$ and has a virtual constant value. Accordingly, as $R(\theta_1, \theta_{01})$ constant, a discussion can be prosecuted as follows.

When the condition of constant $R(\theta_1, \theta_{01})$ in the foregoing is substituted in formula (7) and a constant portion is arranged, this is written as $$\alpha(\theta_{02}, N.A.) = \int_{\theta_{min}}^{\theta_{max}} R(\theta_2, \theta_{02}) \cdot \sin\theta \cdot d\theta \times (\text{constant}) \quad (12)$$

In order to solve analytically formula (12), first, reflectance distribution $R(\theta_2, \theta_{02})$ of the second surface is approximated by the superposition of Lorenz distribution as follows:

$$R(\theta_2, \theta_{02}) = A\left[\frac{1}{(\theta_2 - \theta_{02})^2 + B} + \frac{1}{(\theta_2 + \theta_{02})^2 + B}\right] \quad (13)$$

where
A: constant for normalization $$A = \left(\frac{1}{B} + \frac{1}{2\theta_{02}^2 + B}\right)^{-1} \times R_{max}$$

($R_{max}$ is the maximum value of $R(\theta_2, \theta_{02})$ derived from Fresnel's recurrence formula.)

$$B = B(\theta_{02}) = \left(\frac{2\beta av}{\sin\theta_{02} \cdot \cos\theta_{02}} \cdot \frac{1}{2}\right)^2$$

(Refer to B. Henke, American Institute of Physics 1985) P. 85)

Further, $\beta$av. is the mean value of absorption coefficient of each substance constituting the multilayer film, given by $$\beta = \frac{Na \cdot re \cdot \lambda^2}{2\pi} f_2 \quad (14)$$

where
Na=the number of atoms per unit volume
re=classical electron radius
$f_2$=absorption factor by B. Henke (B. Henke, Atomic data and nuclear data tables 27, 1-14 (1982))

Curve (a) in FIG. 8 shows the diagram in which with respect to the multilayer film laminated periodically with 100 pairs of layers of Re-Al, after the layer thicknesses $d_1$, $d_2$ are optimized by Fresnel's recurrence formula so that the incident angle $\theta_{02}=7.4°$ is formed in the case of the wavelength $\lambda=39.8$ Å, the incident angle is further changed and in which the reflectance calculated by Fresnel's recurrence formula is taken as ordinate and the incident angle as abscissa.

Further, curve (b) in FIG. 8 is approximate reflectance distribution obtained from formula (13) and it is noted that curve (b) approximates favorably to actual distribution (a). Here, $\theta_2$ can be approximated as the function of $\theta$ as follows:

$$\theta_2 \approx \epsilon\theta = \left\{ \frac{1}{2}\left(1 + \frac{1}{m}\right) + \frac{W}{r_1} \right\}\theta \quad (15)$$

Substituting formulas (13) and (15) in formula (12) to execute the integral, the following formula is obtained.

$$\alpha(\theta_{02}, N.A.) = \left[ \frac{1}{2\,\epsilon^2} \{\log|(\epsilon\theta - \theta_{02})^2 + B| + \right. \quad (16)$$

$$\log|(\epsilon\theta + \theta_{02})^2 + B|\} + \frac{\theta_{02}}{\epsilon^2 \cdot \sqrt{B}} \left\{ \tan^{-1}\frac{\epsilon\theta - \theta_{02}}{\sqrt{B}} - \right.$$

$$\left. \left. \tan^{-1}\frac{\epsilon\theta + \theta_{02}}{\sqrt{B}} \right\} \right]_{\theta_{min}}^{\theta_{max}} \times (\text{constant})$$

In addition, by substituting formulas (10) and (11) in $\theta_{max}$ and $\theta_{min}$, respectively, the total transmittance $\alpha(\theta_{02})$ will be changed into a simplified form such that the function depends on the magnification m and the numerical aperture N.A. of the Schwarzschild optical system.

(3) Now, a description will next be given of the conditions to be satisfied by the incident angle of the light entering the concave mirror of the Schwarzschild optical system.

If the amount of light required for the photosensitivity of an X-ray film is converted into the number of photons, there are indications that its value is nearly 7~8 (Photons/sec·$\mu$m$^2$·1% BW).

Now, in the optical system shown in FIG. 3 and Table 5 as an example, an attempt will be made to estimate the number of photons reaching the image surface of the Schwarzschild optical system. The requirements are set as follows:

Numerical aperture N.A.=0.2
Working wavelength $\lambda$=17.6 Å
Brightness of a light source Ie=4.2×10$^{16}$ (Photons/sec·rad$^2$·mm$^2$·1% BW)
Region on the object surface radiated by X rays=30 $\mu$m in diameter The multilayer film, in view of the present manufacturing technique, is assumed to be laminated with 40 layers (20 pairs of layers) of Re-Ba by the period of constant thickness. The reflectance at the first surface is 1.3% to be constant, while in the reflectance at the second surface, the distribution R($\theta_2$, 7.4°) giving $\alpha_{max}$ is used to calculate the number of photons reaching an image surface (30×100 $\mu$m in diameter), based on formula (8) That is, $$\alpha = 1.23 \times 10^8 \text{ (Photons/sec·1\% BW)}$$

Consequently, the number of photons per 1 $\mu$m diameter on the image surface is $$1.23 \times 10^8/(3000)^2 = 13.7$$

(Photons/sec·$\mu$m$^2$·1% BW)

From the foregoing, it will be seen that when $\alpha$ ($\theta_{02}$, N.A.) deteriorates by nearly 50% compared with $\alpha_{max}$, the situation is the limit of a photosensitive capacity of the film. As such, the incident angle $\theta_{02}$ is determined in the range such that with regard to a particular numerical aperture N.A., the total transmittance $\alpha(\theta_{02}, N.A.)$ given by formula (16) satisfies $$\alpha(\theta_{02}, N.A.)/\alpha_{max} \geq 0.5 \quad (17)$$

The reflectance of the incident ray relative to the multilayer film formed with the same substance reduces as the wavelength $\lambda$ becomes short. Thus, of wavelengths assumed to be used, the limit of the photosensitive capacity of the film in the value of a shorter one has been used to determine the range of $\theta_{02}$ to be satisfied.

Also, in formula (17), since the term of the constant expressed by formula (16) vanishes when the total transmittance $\alpha(\theta_{02}, N.A.)$ is calculated, it is only necessary to use the following formula (18) in which the term of the constant is omitted where $\alpha(\theta_{02}, N.A.)$ is actually calculated:

$$\alpha(\theta_{02}, N.A.) = \left[ \frac{1}{2\,\epsilon^2} \{\log|(\epsilon\theta - \theta_{02})^2 + B| + \right. \quad (18)$$

$$\log|(\epsilon\theta + \theta_{02})^2 + B|\} + \frac{\theta_{02}}{\epsilon^2 \cdot \sqrt{B}} \left\{ \tan^{-1}\frac{\epsilon\theta - \theta_{02}}{\sqrt{B}} - \right.$$

$$\left. \left. \tan^{-1}\frac{\epsilon\theta + \theta_{02}}{\sqrt{B}} \right\}_{\theta_{min}}^{\theta_{max}} \right.$$

(4) The above explanation is relative to the Schwarzschild optical system arranged so that the light from the object point is first incident on the concave mirror and the optical system constructed in this manner has good performance even in the case where the object point and the image point are replaced with each other. FIG. 9 is a diagram showing such a situation.

Of light rays spatially radiated isotropically from the object point O, attention is now directed to a light ray traversing the aperture (hatching portion) of the optical system. The light ray is first incident on the mirror surface of the convex mirror 2 at the incident angle $\theta_2$ determined by the emanating angle u from the object point O. The light reflected at a certain reflectance R($\theta_2$) after this enters then the mirror surface of the concave mirror 1 at the incident angle also determined by the emanating angle u. The light reflected at a certain reflectance R($\theta_1$) after this enters the image point I at the angle $\theta$ made with the optical axis and is converged. The emanating angle u from the object point O, the incident angle $\theta_2$, $\theta_1$ on the mirror surfaces and the incident angle $\theta$ on the image point I are each adapted geometric-optically in one to one with accuracy as in items (1) to (3).

Accordingly, even though the object point O and the image point I of the reflecting optical system coated with the multilayer film designed as in items (1) to (3) are replaced with each other, the incident angles of the light ray on individual mirrors do not change, so that the same reflectance as in items (1) to (3) is attained at the individual mirrors.

From the foregoing, if the object point O and the image point I of the optical system in each of items (1) to (3) are replaced with each other, a demagnifying optical system whose reflection efficiency is favorable is brought about and can be used for X-ray lithography.

This and other objects as well as the features and the advantages of the present invention will become apparent from the following detailed description of the preferred embodiments when taken in conjunction with the accompanying drawings.

DESCRIPTION OF THE PREFERRED EMBODIMENTS

Figure 1:
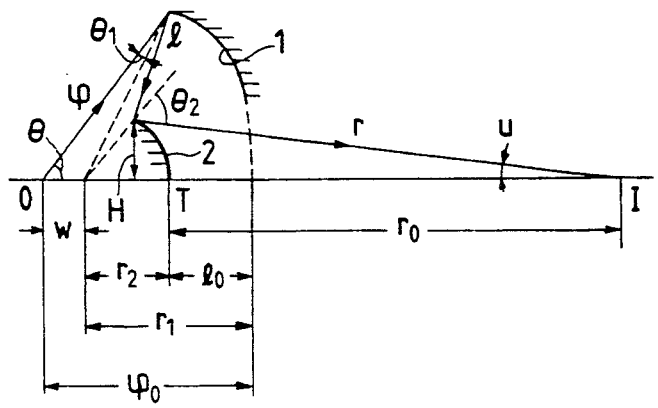
FIG. 1 is a view showing a fundamental arrangement of the Schwarzschild optical system.
Figure 2:
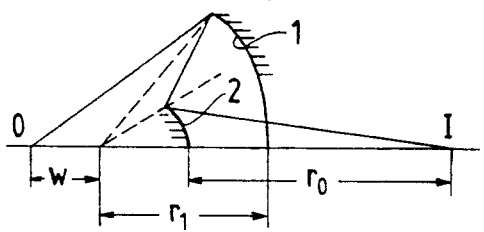
FIG. 2 is a view showing the optical system in which centers of curvature of reflecting mirrors coincide with each other and its parameters.
Figure 4:
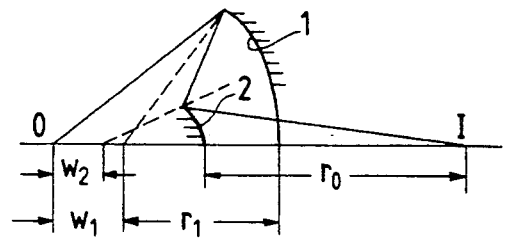
FIG. 4 is a view showing the optical system in which the centers of curvature of the reflecting mirrors are shifted each other at a maximum and its parameters.
Figure 3:
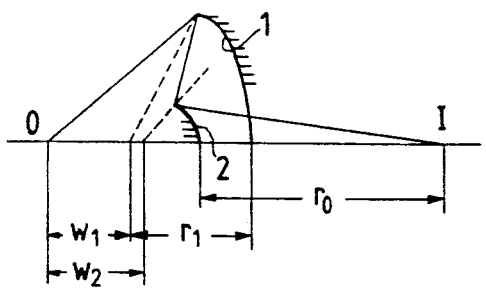
FIG. 3 is a view showing the arrangement of the Schwarzschild optical system and plural sets of parameters designed by an automatic design program.
Figure 5:
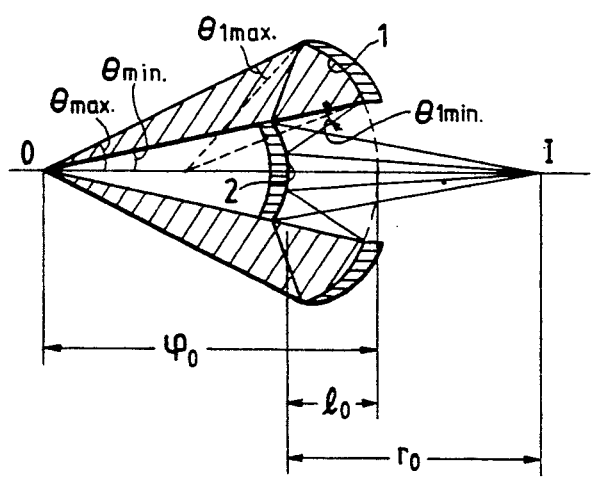
FIG. 5 is a view showing ranges of an aperture and incident angles of the optical system.
Figure 6:
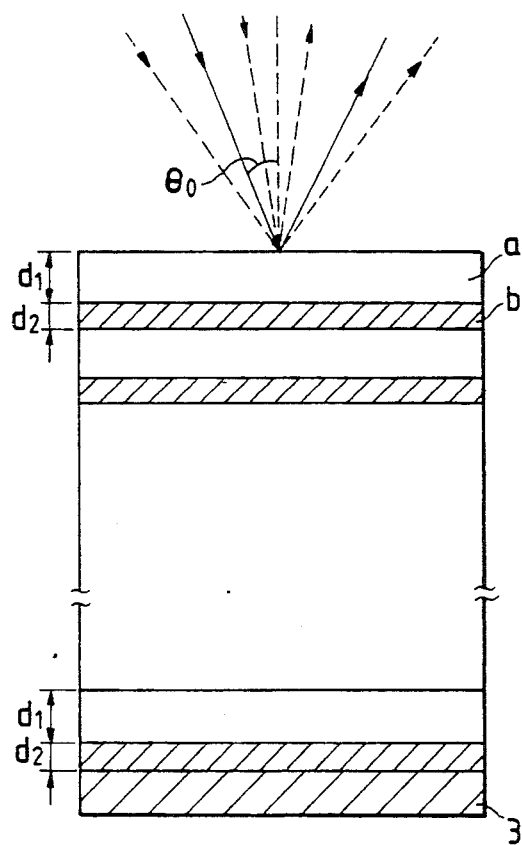
FIG. 6 is a schematic sectional view of a multilayer film reflecting mirror.
Figure 7:
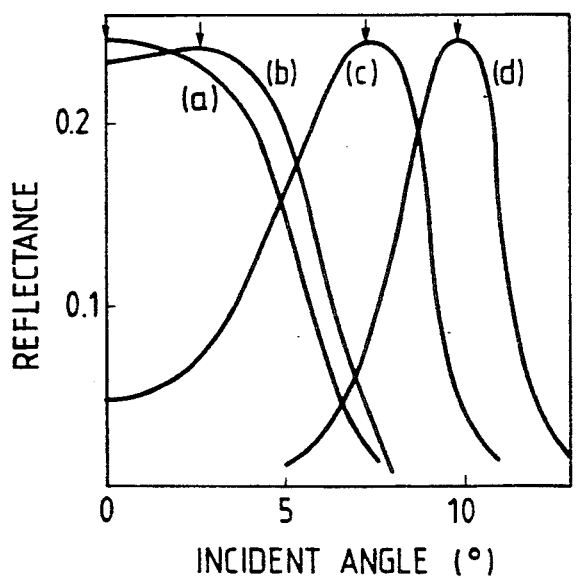
FIG. 7 is a diagram showing reflectance distribution relative to the incident angle of a multilayer film in which Ni-Sc is periodically laminated and layer thickness is optimized by Fresnel's recurrence formula.

In accordance with the embodiments shown in the drawings, the present invention will be described in detail below.

Embodiment 1

Figure 10:
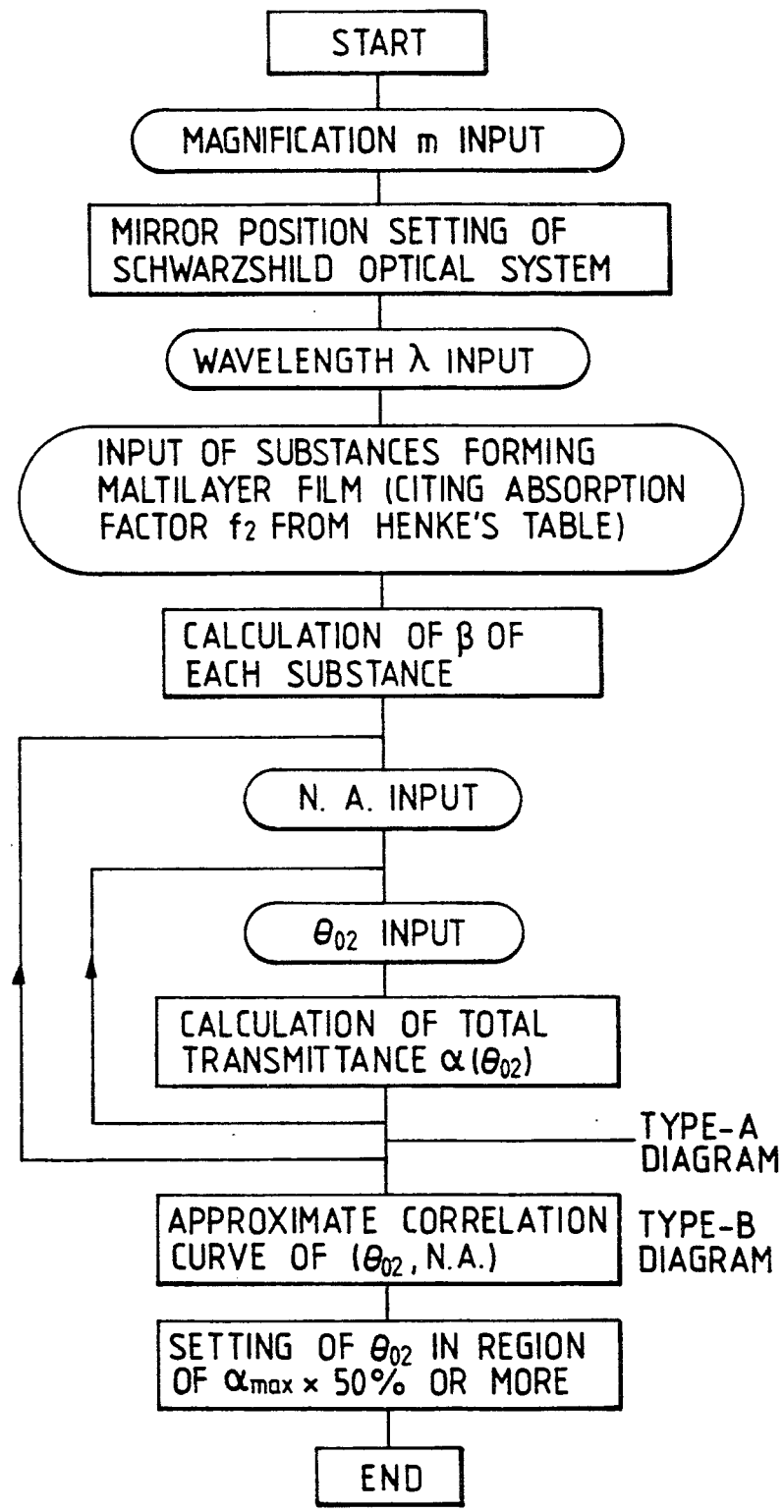
FIG. 10 is a flow chart showing a design process of the multilayer film reflecting mirror used as the concave mirror.

First of all, a description will be made of a design process of the multilayer film reflecting mirror used as the convex mirror 2, based on a flow chart shown in FIG. 10.

(1) The magnification $\bar{m}$ is taken at 100 and the position where the mirror of the optical system is set is determined from formulas (3), (4), (5) and (6). When $r_2 = 1$, the optical system of Table 1 previously shown is obtained.

(2) The wavelength $\lambda$ is taken at 39.8 Å.

(3) The substances constituting the multilayer film are taken as Re and Al and pairs of layers are laminated at the period of constant thickness. The number of layers is 100 pairs of layers in this case.

(4) When values $f_{2Re} = 23.46$ and $f_{2Al} = 4.6$ obtained by citing absorption factors $f_2$ of Re and Al corresponding to $\lambda = 39.8$ Å from the tables of atomic scattering factors measured by Henke et al (B. Henke, Atomic data and nuclear data tables 27, 1–144 (1982)) are substituted in formula (14), $\beta_{Al} = 0.011$ and $\beta_{Re} = 0.0020$ are obtained.

(5) The numerical aperture N.A. of the optical system is taken at 0.207. Thus, the layout of the optical system is completed.

(6) From formulas (10), (11) and (15), $\theta_{2max}$ and $\theta_{2min}$ are calculated to select a proper value as $\theta_{02}$ within the range in which $\theta_{2min}$ is taken as the lower limit and $\theta_{2max}$ as the upper limit. In this instance, the value of $\theta_2$ is selected within the range of $4° \leq \theta_{02} \leq 10°$.

(7) Based on formula (18), the total transmittance $\alpha(\theta_{02})$ is calculated. The process is then returned to step (6) to select another value as $\theta_{02}$ within the above range and the total transmittance $\alpha(\theta_{02})$ is calculated again by using this value.

Figure 11:
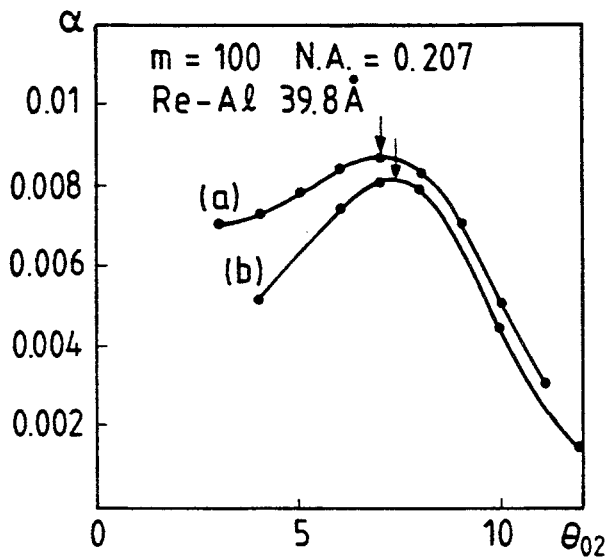
FIG. 11 is a diagram showing the dependence of the incident angle $\theta_{02}$ of the total transmittance $\alpha$ of the optical system in FIG. 3.

(8) Curve (a) in FIG. 11 is a graph showing $\theta_{02}$ dependence of approximate $\alpha$ secured by repetition of steps (6) and (7) and such a graph is hereinafter referred to as a type-A diagram. If this diagram is available, understanding will be given as to what value of $\theta_{02}$ (the incident angle providing the maximum reflectance) of the multilayer film with which the second reflecting mirror is coated should be set in the optical system of a particular N.A..

(9) Curve (b) in FIG. 11 shows the $\theta_{02}$ dependence of the total transmittance $\alpha$ calculated by using formula (8) with respect to the same optical system as in step (1). However, $R(\theta_1, \theta_{01})$ is constant and $R(\theta_2, \theta_{02})$ uses reflectance distribution calculated by Fresnel's recurrence formula. Further, the term of the constant is omitted to coincide with formula (18). As is apparent from the comparison between curves (a) and (b) in FIG. 11, the values of $\theta_{02}$ maximizing the total transmittance $\alpha$ obtained from both the curves approach considerably to each other. This shows that the Schwarzschild optical system having the reflecting mirrors constructed according to formula (18) derived from the present invention approximates very favorably to that constructed without using such approximation as in formula (18).

(10) The numerical aperture N.A. is changed and the type-A diagram is prepared for each N.A.

(11) From the type-A diagram for each N.A., $\theta_{02}$ giving $\alpha_{max}$, $\theta_{02}$ in the case where $\alpha = \alpha_{max} \times 95\%$, and $\theta_{02}$ in the cases where $\alpha = \alpha_{max} \times 80\%$, $\alpha = \alpha_{max} \times 50\%$, and $\alpha = \alpha_{max} \times 30\%$ are determined.

Figure 12:
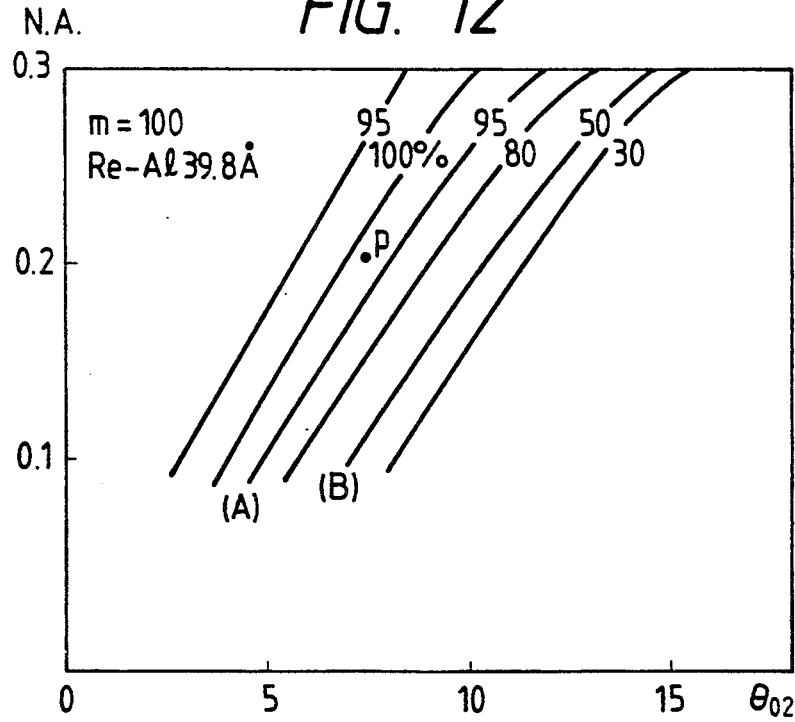
FIG. 12 is an approximate correlation curve diagram of the incident angle $\theta_{02}$ and the numerical aperture N.A. giving the total transmittance $\alpha_{max}$ of the optical system in FIG. 3.
Figure 13:
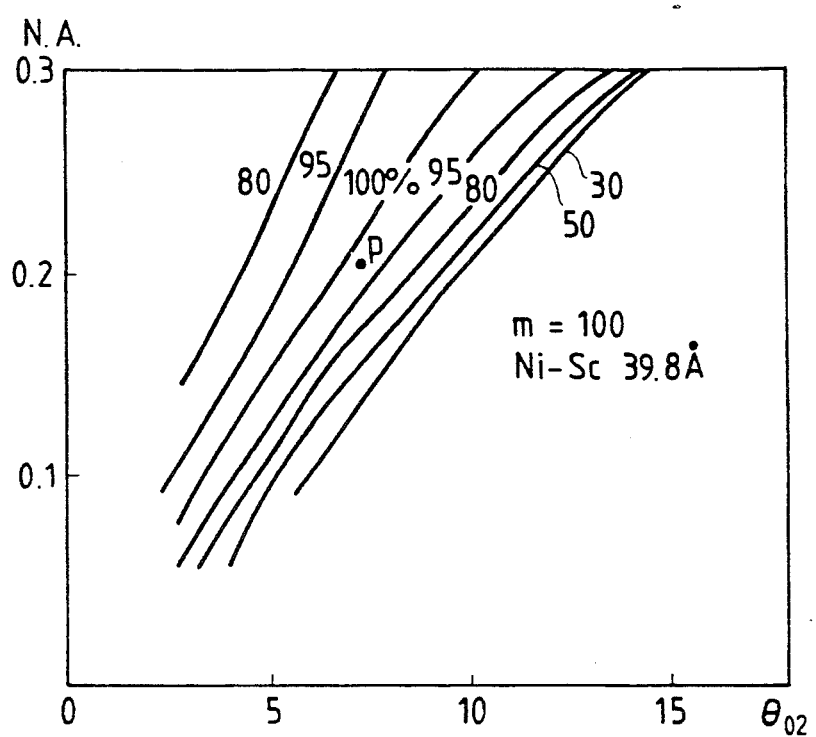
FIGS. 13 to 22 are approximate correlation curve diagrams of the incident angle $\theta_{02}$ and the numerical aperture N.A. giving the total transmittance $\alpha_{max}$ of the optical system in Embodiments 2 to 11, respectively.
Figure 14:
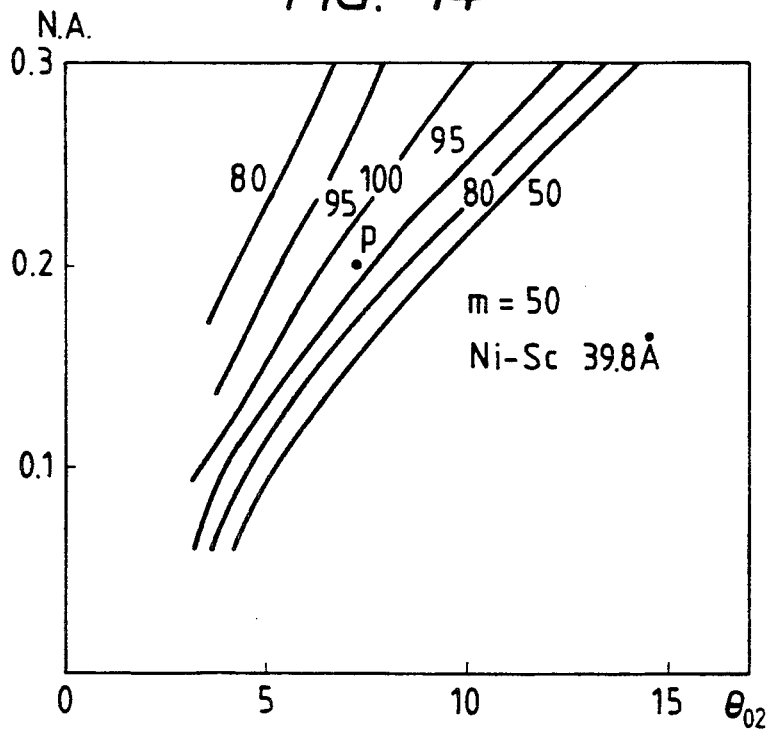
Figure 15:
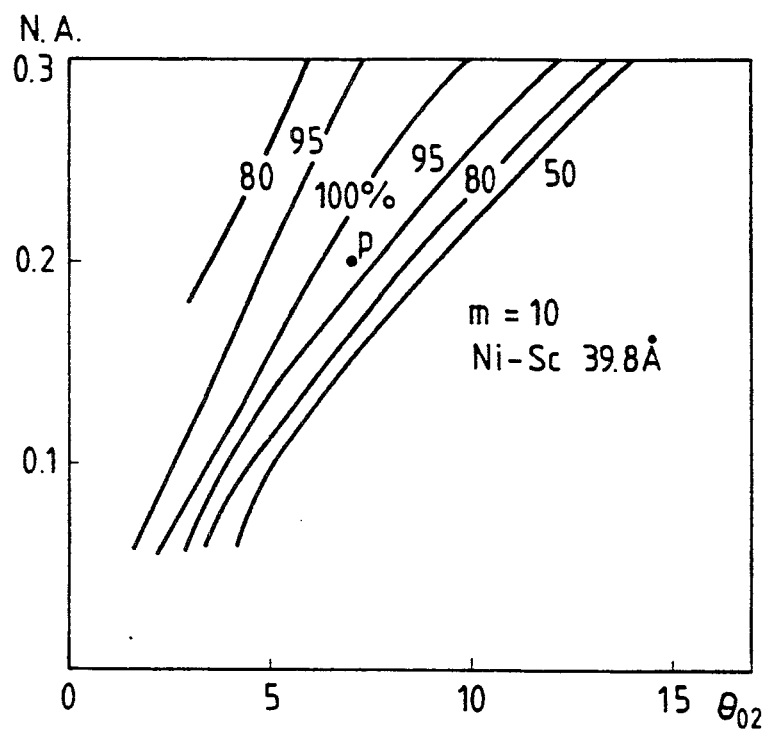
Figure 16:
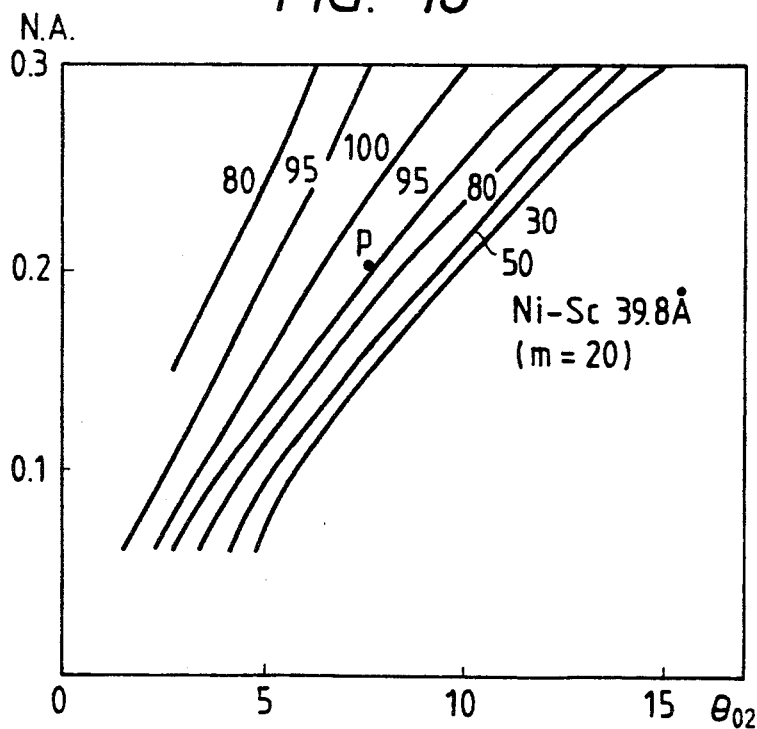
Figure 17:
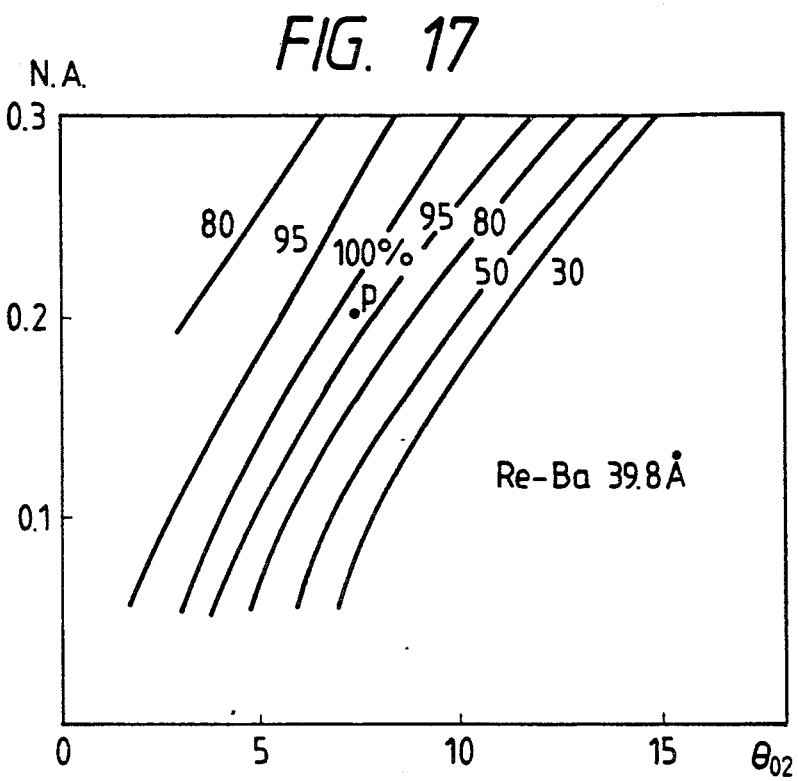
Figure 18:
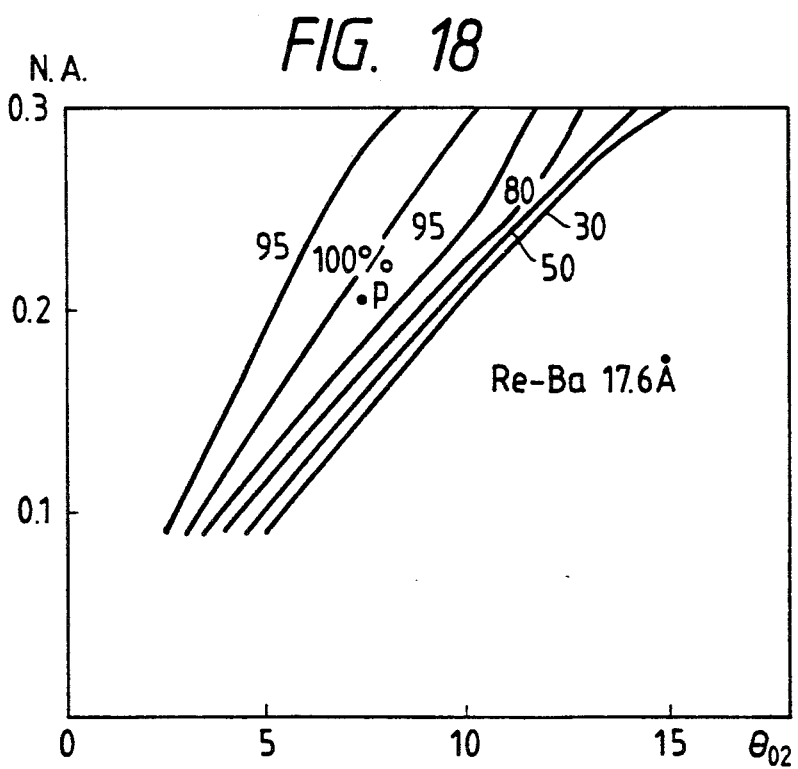
Figure 19:
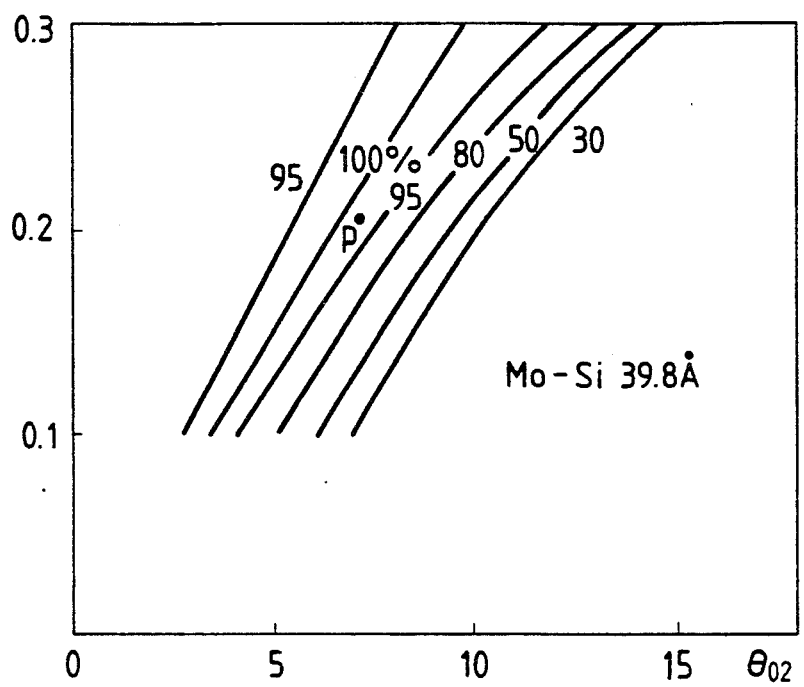
Figure 20:
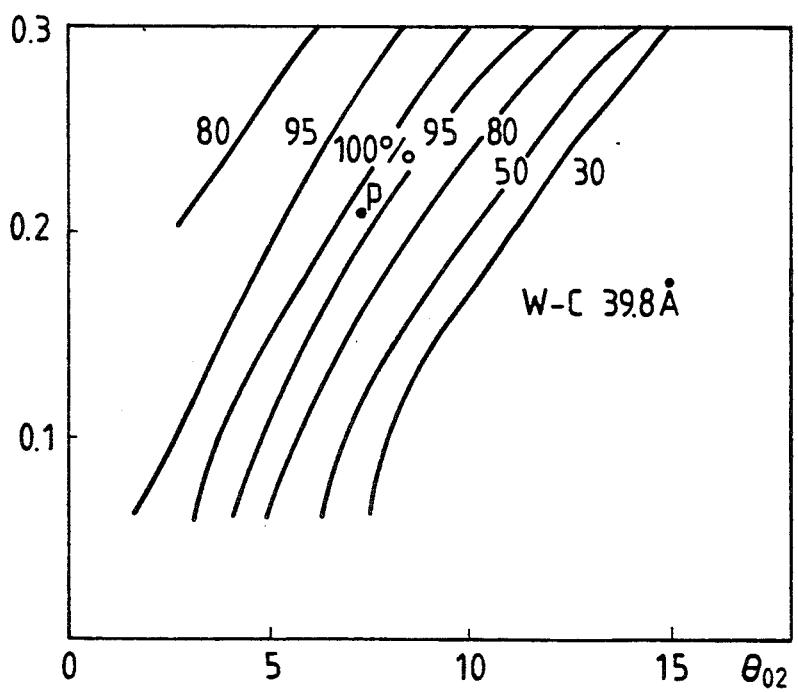
Figure 21:
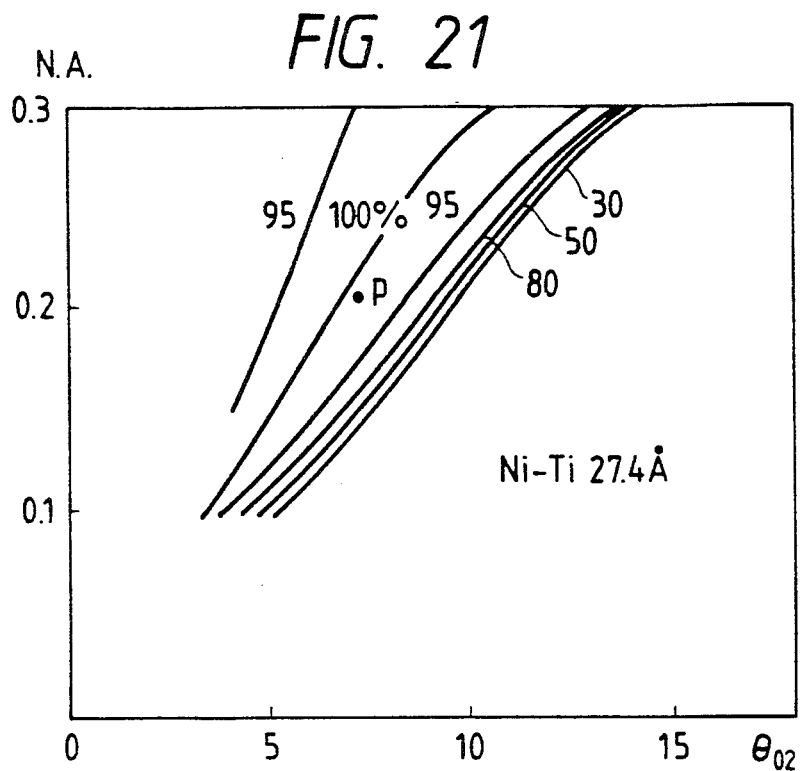
Figure 22:
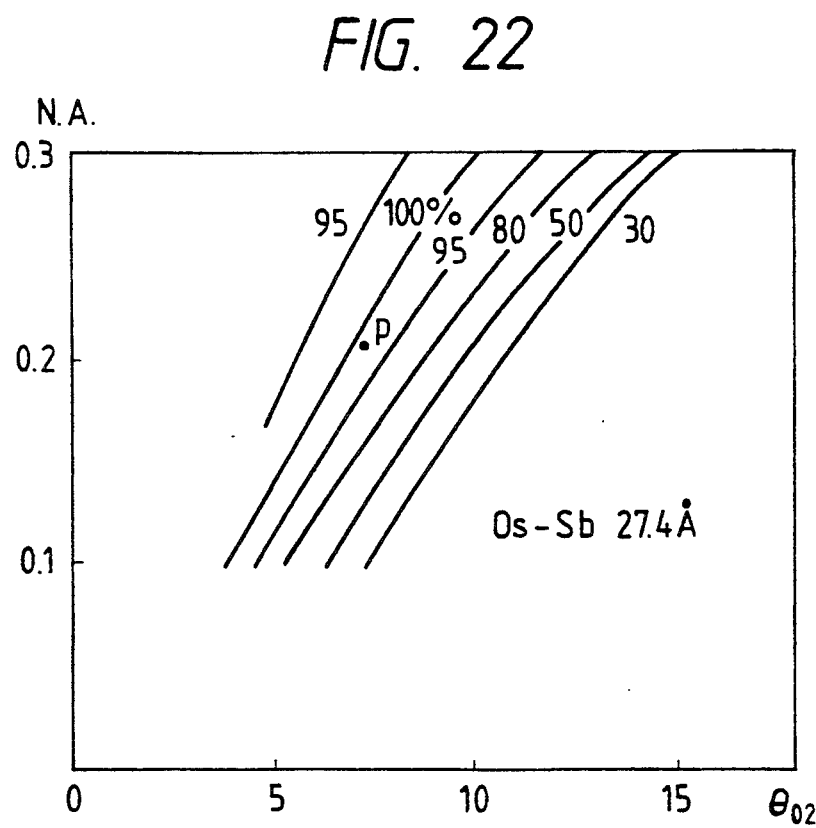

FIG. 12 shows a graph that the values of ($\theta_{02}$, N.A.) giving $\alpha_{max}$ are plotted on the coordinates in which $\theta_{02}$ is taken as abscissa and N.A. as ordinate and they are connected with smooth curves, while the values of ($\theta_{02}$, N.A.) giving $\alpha=\alpha_{max}\times 95\%$, $\alpha=\alpha_{max}\times 80\%$, $\alpha=\alpha_{max}\times 50\%$, and $\alpha=\alpha_{max}\times 30\%$ are likewise plotted and they are smoothly connected. These are referred to as approximate correlation curves of $\theta_{02}$ and N.A. and such a graph is called a type-B diagram. According to this diagram, information can be provided as to, in the Schwarzschild optical system of various numerical apertures, what value of $\theta_{02}$ should be selected in response to the numerical apertures. Further, in the diagram, a point P, which plots the relationship between $\theta_{02}$ and N.A. providing $\alpha_{max}$ derived from curve (b) in FIG. 11, is located in the range of more than 95% of $\alpha_{max}$ with regard to the approximate correlation curves. This means that the transmittance of the Schwarzschild optical system having the reflecting mirror constructed according to the total transmittance $\alpha$ calculated by means of formula (8) is extremely favorable.

The point P corresponds to $\theta_{02}=7.4°$ and then the second reflecting mirror is constructed. The layer thicknesses of Al and Re can be determined as $D_{Al}=7.28$ Å and $D_{Re}=12.9$ Å, respectively.

Also, in FIG. 12, for example, approximate correlation curve (A) can linearly be approximated by N.A. $=0.0037 \theta_{02}+0.02$ and approximate correlation curve (B) by N.A.$=0.027\theta_{02}-0.08$. Accordingly, the use of this approximation makes it possible to determine $\theta_{02}$ for securing a certain total transmittance $\alpha$ in the optical system in which N.A. is predetermined, on a calculation without viewing often the type-B diagram.

The requirements of the optical system in this embodiment are concluded as follows:
  (i) Optical system magnification m=100
  (ii) Wavelength $\lambda=39.8$ Å
  (iii) Multilayer film Al-Re 100 pairs of layers $\beta_{Al}=0.011$, $\beta_{Re}=0.002$
  (iv) N.A.=0.207, $\theta_{02}=7.4°$ Layer thicknesses $D_{Al}=7.28$ Å, $D_{Re}=12.9$ Å

Figure 8:
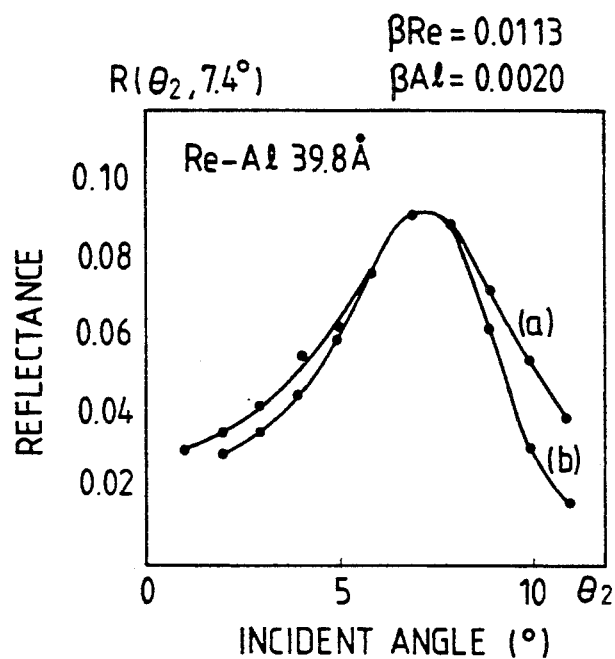
FIG. 8 is a diagram showing the reflectance distribution relative to the incident angle of the multilayer film in which Re-Al is periodically laminated and the layer thickness is optimized by Fresnel's recurrence formula.
Figure 9:
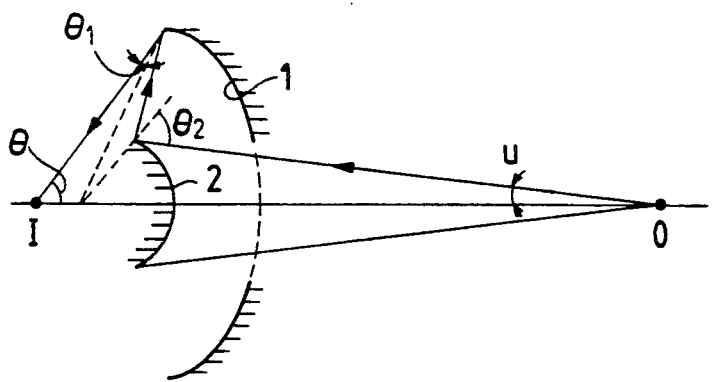
FIG. 9 is a view showing the arrangement in the case where the object point and the image point of the optical system in FIG. 3 are replaced with each other.

The reflectance of the reflecting mirror comprised of the Al-Re multilayer film is as shown by curve (a) in FIG. 8.

The following shows other embodiments, in which only the requirements of the optical system are listed and detailed explanations, which are the same as in Embodiment 1, are omitted.

Embodiment 2

(i) m=100
  (ii) $\lambda=39.8$ Å
  (iii) Ni—Sc, 100 pairs of layers $\beta_{Ni}=0.00412$, $\beta_{Sc}=0.000574$
  (iv) N.A.=0.207, $\theta_{02}=7.4°$ $D_{Ni}=8.28$ Å, $D_{Sc}=11.9$ Å

Embodiment 3

(i) m=50
  (ii) $\lambda=39.8$ Å
  (iii) Ni—Sc, 100 pairs of layers $\beta_{Ni}=0.00412$, $\beta_{Sc}=0.000574$
  (iv) N.A.=0.207, $\theta_{02}=7.4°$ $D_{Ni}=8.28$ Å, $D_{Sc}=11.9$ Å

Embodiment 4

(i) m=10
  (ii) $\lambda=39.8$ Å
  (iii) Ni—Sc, 100 pairs of layers $\beta_{Ni}=0.00412$, $\beta_{Sc}=0.000574$
  (iv) N.A.=0.207, $\theta_{02}=7.4°$ $D_{Ni}=8.28$ Å, $D_{Sc}=11.9$ Å

Embodiment 5

(i) m=20
  (ii) $\lambda=39.8$ Å
  (iii) Ni—Sc, 100 pairs of layers $\beta_{Ni}=0.00412$, $\beta_{Sc}=0.000574$
  (iv) N.A.=0.207, $\theta_{02}=7.8°$ $D_{Ni}=8.08$ Å, $D_{Sc}=12.1$ Å

FIGS. 13 to 16 are type-B curve diagrams of Embodiments 2 to 5, respectively.

Also, in Embodiments 3 and 4, the requirements shown in Tables 6 and 7 are used as a fundamental arrangement for the object point, the image point and two reflecting mirrors. Further, in Embodiment 5, the requirements shown in Table 8 are employed. As is obvious from Embodiments 3 to 5, it will be seen that the present invention provides favorable results even in the optical system in which the centers of curvature of two reflecting mirrors are somewhat shifted each other.

Embodiment 6

(i) m=100
  (ii) $\lambda=39.8$ Å
  (iii) Re—Ba, 100 pairs of layers $\beta_{Re}=0.0113$, $\beta_{Ba}=0.000594$
  (iv) N.A.=0.207, $\theta_{02}=7.4°$ $D_{Re}=6.45$ Å, $D_{Ba}=13.7$ Å

Embodiment 7

(i) m=100
  (ii) $\lambda=17.6$ Å
  (iii) Re—Ba, 100 pairs of layers $\beta_{Re}=0.00227$, $\beta_{Ba}=0.000145$
  (iv) N.A.=0.207, $\theta_{02}=7.4°$ $D_{Re}=3.91$ Å, $D_{Ba}=4.98$ Å

Embodiment 8

(i) m=100
  (ii) $\lambda=39.8$ Å
  (iii) Mo—Si, 100 pairs of layers $\beta_{Mo}=0.00663$, $\beta_{Si}=0.00209$
  (iv) N.A.=0.207, $\theta_{02}=7.4°$ $D_{Mo}=8.47$ Å, $D_{Si}=11.7$ Å

Embodiment 9

(i) m=100
  (ii) $\lambda=39.8$ Å
  (iii) W—C, 100 pairs of layers $\beta_W=0.0104$, $\beta_C=0.00323$
  (iv) N.A.=0.207, $\theta_{02}=7.4°$ $D_W=8.07$ Å, $D_C=12.1$ Å

Embodiment 10

(i) m=100
  (ii) $\lambda=27.4$ Å
  (iii) Ni—Ti, 100 pairs of layers $\beta_{Ni}=0.00136$, $\beta_{Ti}=0.00327$
  (iv) N.A.=0.207, $\theta_{02}=7.4°$ $D_{Ni}=6.51$ Å, $D_{Ti}=7.34$ Å

Embodiment 11

(i) m=100
  (ii) $\lambda=27.4$ Å
  (iii) Os—Sb, 100 pairs of layers $\beta_{Os}=0.00597$, $\beta_{Sb}=0.00416$
  (iv) N.A.=0.207, $\theta_{02}=7.4°$ $D_{Os}=6.37$ Å, $D_{Sb}=7.48$ Å

FIGS. 17 to 22 are type-B curve diagrams of Embodiments 6 to 11.

Within the range of wavelengths of nearly 17–60 Å, it is desirable that when, among the approximate correlation curves providing the total transmittance of 95% of $\alpha_{max}$, one with a small incident angle is taken as (A) and one providing the total transmittance of 50% of $\alpha_{max}$ as (B), the relationship between N.A. and $\theta_{02}$ is set in the region between curves (A) and (B).

Also, curves (A) and (B) can be approximated by linearities:

N.A. = $0.037\theta_{02} + 0.02$

N.A. = $0.027\theta_{02} + 0.08$

What is claimed is:

1. A Schwarzschild optical system having a pair of first and second conjugate points, wherein said Schwarzschild optical system with a magnification m, comprising a multilayer film concave mirror having a radius of curvature $r_1$ and an aperture at a center portion of said concave mirror, disposed a distance $\rho_0$ apart from said first conjugate point toward said second conjugate point and a multilayer film convex mirror having a radius of curvature $r_2$, disposed a distance $r_0$ apart from said second conjugate point toward said first conjugate point and a vertex distance $l_0$ apart from said concave mirror satisfies $2m\, l_0\rho_0/(m\rho_0+ml_0-r_0)\times 0.9 \leq r_1 \leq 2\, m\, l_0\rho_0/(m\rho_0+ml_0-r_0)\times 1.1$ $2\, l_0 r_0/(r_0+l_0-m\rho_0)\times 0.9 \leq r_2 \leq 2\, l_0 r_0/(r_0+l_0-m\rho_0)\times 1.1$ and where an effective diameter H of said convex mirror is given by $$\frac{r_0}{m}(N.A.)\times 0.8 \leq H \leq \frac{r_0}{m}(N.A.)\times 1.5$$

in accordance with a numerical aperture N.A. on the side of said first conjugate point of said Schwarzschild optical system, the reflecting surface of said convex mirror is provided with a uniform multilayer film such that an incident angle $\theta_{02}$ at which reflectance is maximized with respect to light of a particular wavelength $\lambda$ satisfies the following condition in regard to said numerical aperture:

$\alpha(\theta_{02}, N.A.) \geq 0.5\, \alpha_{max}$ where $$\alpha(\theta_{02}, N.A.) = \left[\frac{1}{2\epsilon^2}\{\log|(\epsilon\theta - \theta_{02})^2 + B| +$$

$$\log|(\epsilon + \theta_{02})^2 + B|\} + \frac{\theta_{02}}{\epsilon^2\cdot\sqrt{B}}\tan^{-1}\frac{\epsilon\theta - \theta_{02}}{\sqrt{B}} -$$

$$\tan^{-1}\frac{\epsilon\theta + \theta_{02}}{\sqrt{B}}\right]_{\theta_{min}}^{\theta_{max}}$$

$\epsilon = \frac{1}{2}\left(1 + \frac{1}{m}\right) + \frac{\rho_0 - r_1}{r^1}$ $\theta_{max} = \sin^{-1}(N.A.)$ $\theta_{min} = \frac{r_0}{\rho_0 - r_1 + r_2}\cdot\frac{1}{m}\cdot(N.A.)$ $B = 2\beta/(\sin\theta_{02}\cdot\cos\theta_{02})$ $\beta$ = mean value of an imaginary part of complex index of refraction in the multilayer film
$\alpha_{max}$ = maximum value of $\alpha(\theta_{02}, N.A.)$.

2. A Schwarzschild optical system according to claim 1, wherein said concave mirror is coated with a uniform multilayer film such that an incident angle $\theta_{01}$ at which reflectance is maximized with respect to said light of the particular wavelength $\lambda$ satisfies the following condition:

$\theta_{1min} < \theta_{01} < \theta_{1max}$ where $\theta_{1min} = \frac{(\rho_0 - r_1)}{r_1}\theta_{min}$ $\theta_{1max} = \frac{(\rho_0 - r_1)}{r_1}\theta_{max}$.

3. A Schwarzschild optical system according to claim 1 or 2, wherein an object is placed at said first conjugate point and an image of said object is formed at said second conjugate point.

4. A Schwarzschild optical system according to claim 1 or 2, wherein an object is placed at said second conjugate point and an image of said object is formed at said first conjugate point.

* * * * *